(12) United States Patent
Kagaya et al.

(10) Patent No.: US 6,698,224 B2
(45) Date of Patent: Mar. 2, 2004

(54) ELECTRONIC APPARATUS HAVING AT LEAST TWO ELECTRONIC PARTS OPERATING AT DIFFERENT TEMPERATURES

(75) Inventors: Noriyuki Kagaya, Tokyo (JP); Yoichi Okubo, Tokyo (JP); Masaki Suto, Tokyo (JP); Hideaki Takahashi, Tokyo (JP); Takashi Uchida, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/263,710

(22) Filed: Oct. 4, 2002

(65) Prior Publication Data

US 2003/0084677 A1 May 8, 2003

(30) Foreign Application Priority Data

Nov. 7, 2001 (JP) ........................ 2001-341495
Feb. 12, 2002 (JP) ........................ 2002-034283

(51) Int. Cl.[7] ............... F25D 23/12; F25B 21/02; H05K 7/20
(52) U.S. Cl. ............... 62/259.2; 62/3.7; 361/688; 361/716
(58) Field of Search ............... 62/259.2, 3.7; 361/688, 716

(56) References Cited

U.S. PATENT DOCUMENTS

| | | | | |
|---|---|---|---|---|
| 5,409,547 A | * | 4/1995 | Watanabe et al. | 136/204 |
| 5,603,220 A | * | 2/1997 | Seaman | 62/3.7 |
| 5,704,212 A | * | 1/1998 | Erler et al. | 62/3.2 |
| 6,112,527 A | * | 9/2000 | Steinmeyer et al. | 62/6 |
| 6,156,970 A | * | 12/2000 | Harting et al. | 174/52.1 |
| 6,226,994 B1 | * | 5/2001 | Yamada et al. | 62/3.7 |
| 6,298,670 B1 | * | 10/2001 | Pundak | 62/6 |
| 6,366,461 B1 | * | 4/2002 | Pautsch et al. | 361/690 |
| 6,367,266 B1 | * | 4/2002 | Kobayashi et al. | 62/51.1 |

* cited by examiner

Primary Examiner—William C. Doerrler
Assistant Examiner—Filip Zec
(74) Attorney, Agent, or Firm—Bacon & Thomas, PLLC

(57) ABSTRACT

An electronic apparatus includes a thermally insulated vessel having a cooling part therein. Disposed inside the thermally insulated vessel are a first electronic part and a second electronic part. The second electronic part is spaced apart from the cooling part while the first electronic part is in direct contact with the cooling part, such that the two electronic parts can operate at different cooling temperatures.

9 Claims, 7 Drawing Sheets

FIG.4 TEMPERATURE MEASUREMENT WITH RADIATION PLATE

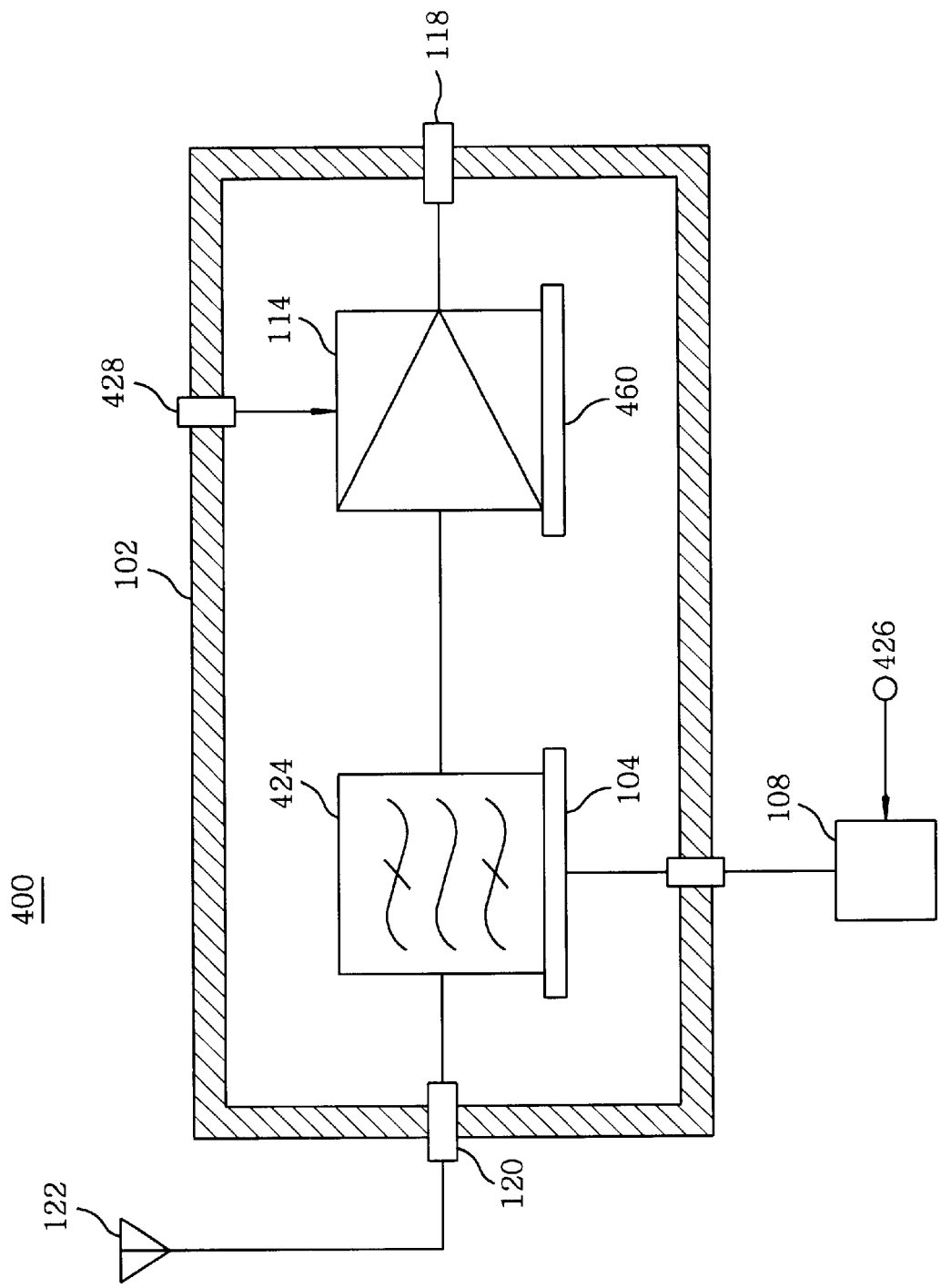

ELECTRONIC APPARATUS HAVING AT LEAST TWO ELECTRONIC PARTS OPERATING AT DIFFERENT TEMPERATURES

FIELD OF THE INVENTION

The present invention relates to an electronic apparatus having at least two electronic parts operating at different temperatures, respectively; and, more particularly, to an electronic apparatus employing a cooling structure for cooling at least two electronic parts operating at different cooling temperatures, respectively.

BACKGROUND OF THE INVENTION

More than two electronic parts or electronic units are usually used in a single electric circuit of an electronic apparatus, e.g., a communications apparatus. Such electronic parts or units of the electronic apparatus can operate at different operating temperatures, respectively, and such being the case, there may exist electronic parts that need to be operated at low or ultra low temperatures.

FIG. 1 shows an electronic apparatus 1 employing a conventional cooling structure for cooling such electronic parts operating at low temperatures. The electronic apparatus 1 includes a thermally insulated vacuum vessel 2 and a cold head 4 disposed therein. The cold head 4 is thermally connected with a cooler 8 via a supporting column 3, which hermetically passes through a lower portion of the thermally insulated vessel 2. The supporting column 3 further serves as a passageway for circulating coolant of the cooler 8 between the cold head 4 and the cooler 8.

Mounted on the cold head 4 are a superconducting filter 10, an isolator 12, and a low noise amplifier 14, which are electrically connected together via a cable 16. One end of the cable 16 is electrically connected to an external electronic apparatus (not shown), e.g., a communications apparatus, via a first connector 18. The other end thereof is coupled to an external antenna 22 via a second connector 20, wherein each of the connectors 18, 20 is of a thermal insulator.

A signal received by the antenna 22 is inputted to the superconducting filter 10 via the second connector 20 and the cable 16 and then passes through the isolator 12 and the low noise amplifier 14 in sequence. The signal is finally transmitted to the external electronic apparatus via the cable 16 and the first connector 18. Herein, the isolator 12 serves to prevent the superconducting filter 10 from being affected by an input impedance of the low noise amplifier 14.

The superconducting filter 10 is a cryogenic module that can withstand a cooling at a cryogenic temperature, e.g., about 60 K or lower. The cooler 8 cools the cold head 4, which is in contact with the superconducting filter 10 at about 60 K, thereby cooling the superconducting filter 10 to an equivalent temperature of about 60 K at which the superconducting filter 10 can properly function. Herein, the isolator 12 and the low noise amplifier 14, which are adjacent to the superconducting filter 10, are also in contact with the cold head 4, having the equivalent cooling temperature of 60 K.

However, such cooling condition may have an adverse effect on a non-cryogenic electronic part, more specifically, an electronic part having a higher warranted operation temperature. Normally, the isolator 12 is usually a non-cryogenic type having a warranted operation temperature of about 200 K. Thus when operated and cooled at a cryogenic temperature, an erroneous operation or even a breakage thereof may occur. Employing a cryogenic isolator, instead of the non-cryogenic type, can avoid the problems mentioned above in the prior art, but the cryogenic isolator bears high cost and, therefore, is rarely used.

Referring to FIG. 2, another exemplary prior art communications apparatus, more specifically, a receiver 11 having a cooling structure will be explained. Like numerals represent like parts in FIGS. 1 and 2 and thus a detailed description thereof will be omitted.

The receiver 11 includes a thermally insulated vacuum vessel 2 and a cold head 4 disposed therein. The cold head 4 is thermally connected with a cooler 8, which is disposed outside of the thermally insulated vessel 2. Mounted on the cold head 4 are a band pass filter 24 and a low noise amplifier 14. The band pass filter 24 serves to select a desired band signal and the low noise amplifier 14 serves to amplify the selected band signal to a desired level.

The band pass filter 24 is usually a superconducting filter having a component made of a superconducting material, preferably, a high temperature superconducting material, such as bismuth (Bi)-based, titanium (Ti)-based, lead (Pb)-based or Yttrium (Y)-based copper oxide. The high temperature superconducting filter (HTSF) is of a micro-stripe type thin film HTSF or a common resonator type thick film HTSF.

The power for the low noise amplifier 14 is supplied from an external power source (not shown) via a power terminal 28. The low noise amplifier 14 is accommodated inside the thermally insulated vessel 2 for the purpose of noise reduction. In such a case, a cryogenic low noise amplifier (CLNA) is preferably used. A Dewar vessel can be advantageously employed as the thermally insulated vessel 2.

The cooler 8 cools the band pass filter 24 at a cryogenic temperature to realize a superconducting state thereof, wherein power is supplied to the cooler 8 via an external power source terminal 26. The cooler 8 is usually a cryocooler, which repeatedly compresses and expands helium gas during a heat exchange cycle so that cryogenic temperatures in the range of 10s of Kelvins can be obtained. In general, a pulse type Sterling cycle cryocooler of a small size is used for the cooler 8.

The cryogenic temperature of the band pass filter 24 and the low noise amplifier 14 provides several advantages in that: a thermal noise thereof can be reduced; an insert loss of the band pass filter 24 can be reduced; and an attenuation characteristic of the band pass filter 24 can be greatly improved. As a result, by using the receiver 11 of FIG. 2, an output signal of a desired carrier-to-noise (C/N) power ratio can be obtained even for a low level input signal.

Such a cryogenic low noise amplifier operable at the cryogenic temperature is costly. To reduce the cost, a non-cryogenic low noise amplifier may be disposed outside the thermally insulated vessel in replacement of the cryogenic low noise amplifier. However, an elongated signal passage between the low noise amplifier and the band pass filter increases loss of signals transmitted therebetween.

SUMMARY OF THE INVENTION

It is, therefore, a primary object of the present invention to provide an electronic apparatus employing a cooling structure for cooling at least two electronic parts operating at different temperatures.

In accordance with a preferred embodiment of the present invention, there is provided an electronic apparatus having at least two electronic parts which operate at different temperatures, respectively, including: a thermally insulated vessel having a cooling part therein; a first electronic part disposed inside the vessel; and a second electronic part disposed inside the vessel, wherein the second electronic part is spaced apart from the cooling part while the first electronic part is in direct contact with the cooling part.

In accordance with another preferred embodiment of the present invention, there is provided a receiver including: a thermally insulated vessel; a cold head disposed inside the thermally insulated vessel; a superconducting filter mounted on the cold head; a low noise amplifier disposed inside the thermally insulated vessel, wherein the low noise amplifier is spaced apart from the cold head and electrically connected to the superconducting filter; and a radiation plate attached to the low noise amplifier.

BRIEF DESCRIPTION OF THE DRAWINGS

The above and other objects and features of the present invention will become apparent from the following description of preferred embodiments given in conjunction with the accompanying drawings, in which:

FIG. 9 gives a schematic sectional front view of a receiver in accordance with the preferred embodiment of the present invention.

DETAILED DESCRIPTION OF THE PREFERRED EMBODIMENT

Figure 1:
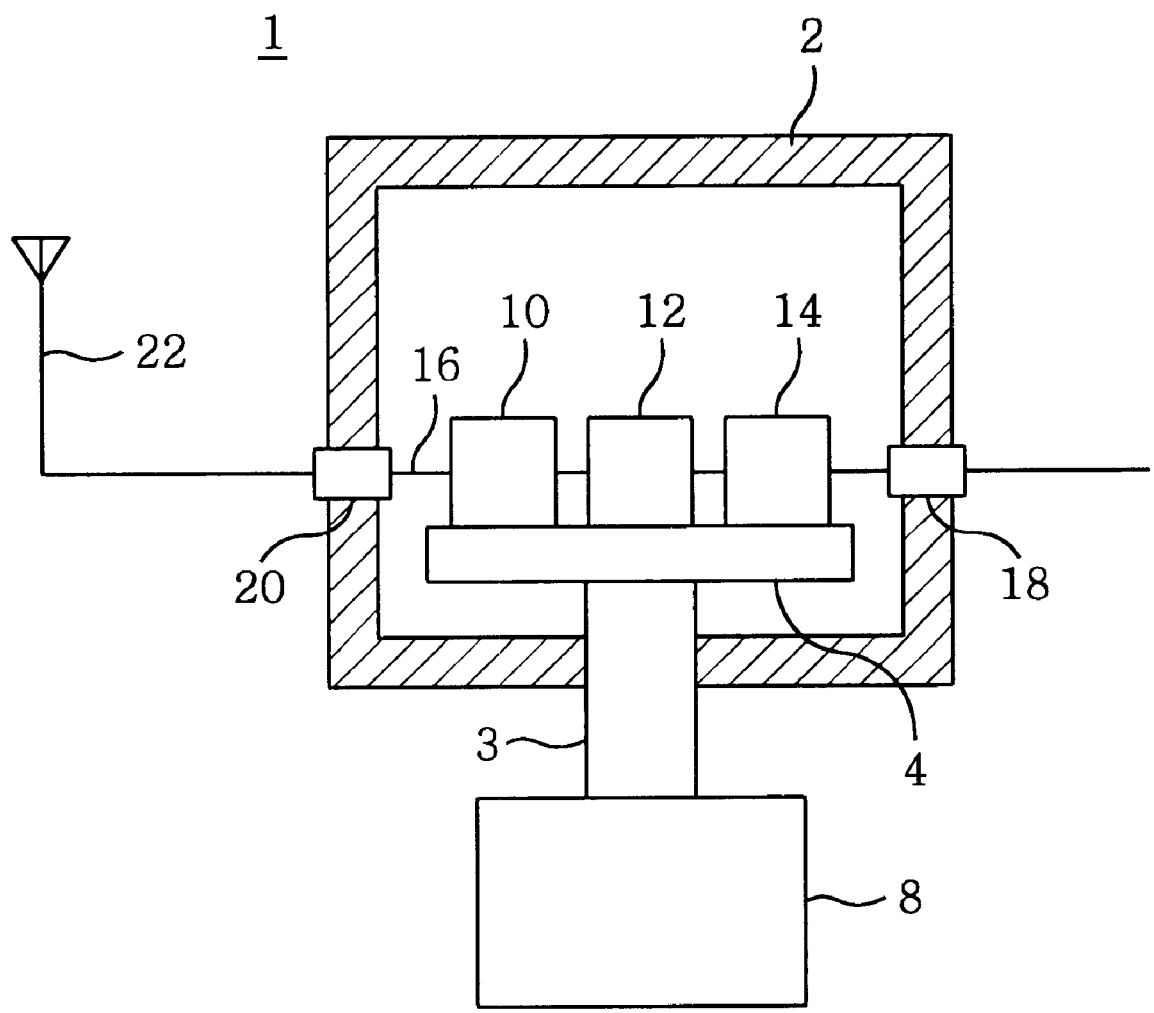
FIG. 1 presents a schematic sectional front view of an electronic apparatus according to a prior art.
Figure 2:
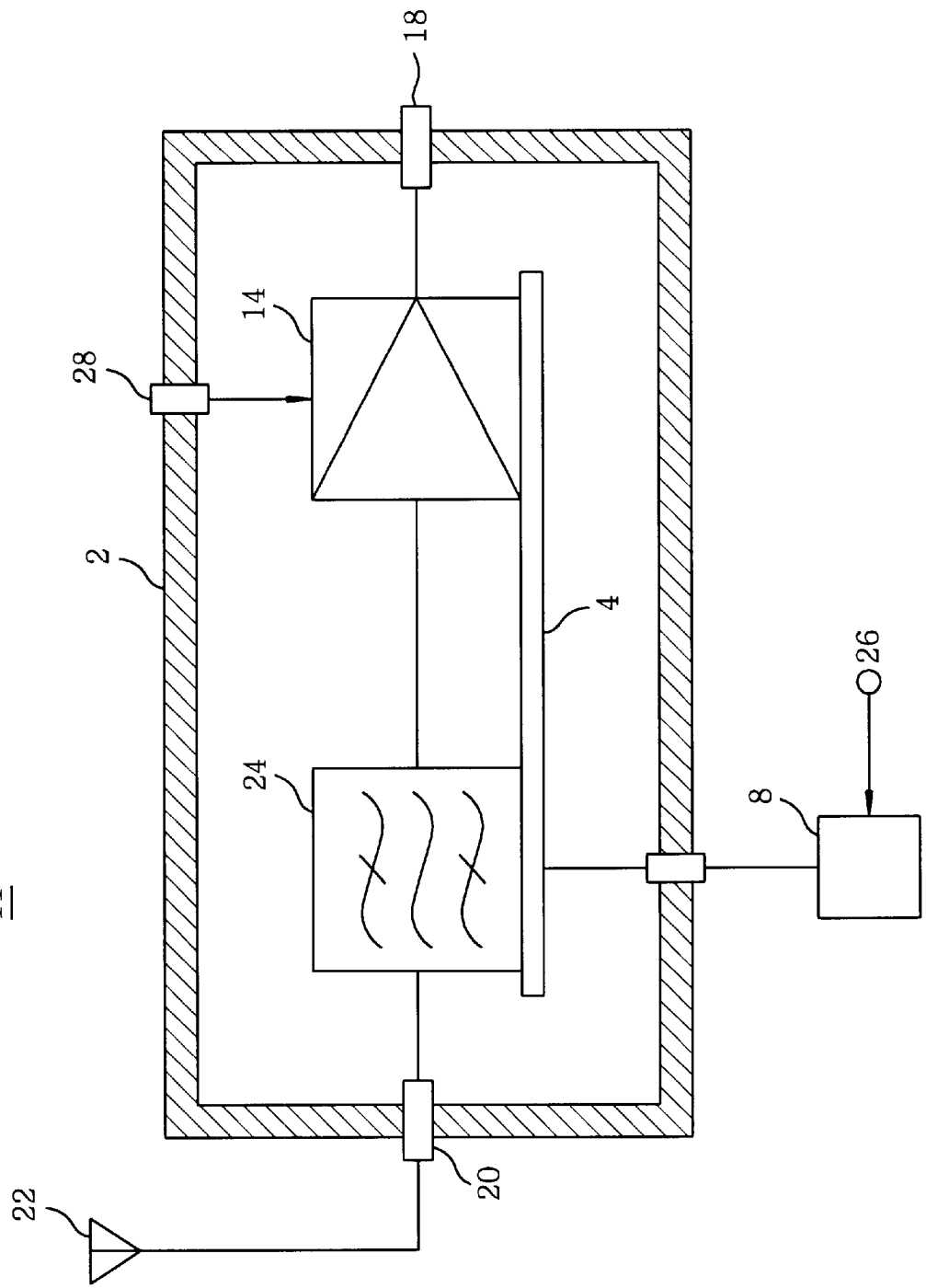
FIG. 2 is a schematic sectional front view of a receiver according to the prior art.

Referring now to FIGS. 3 to 9, electronic apparatuses in accordance with preferred embodiments of the present invention will be described in detail. Like numerals represent like parts in the drawings.

Figure 3:
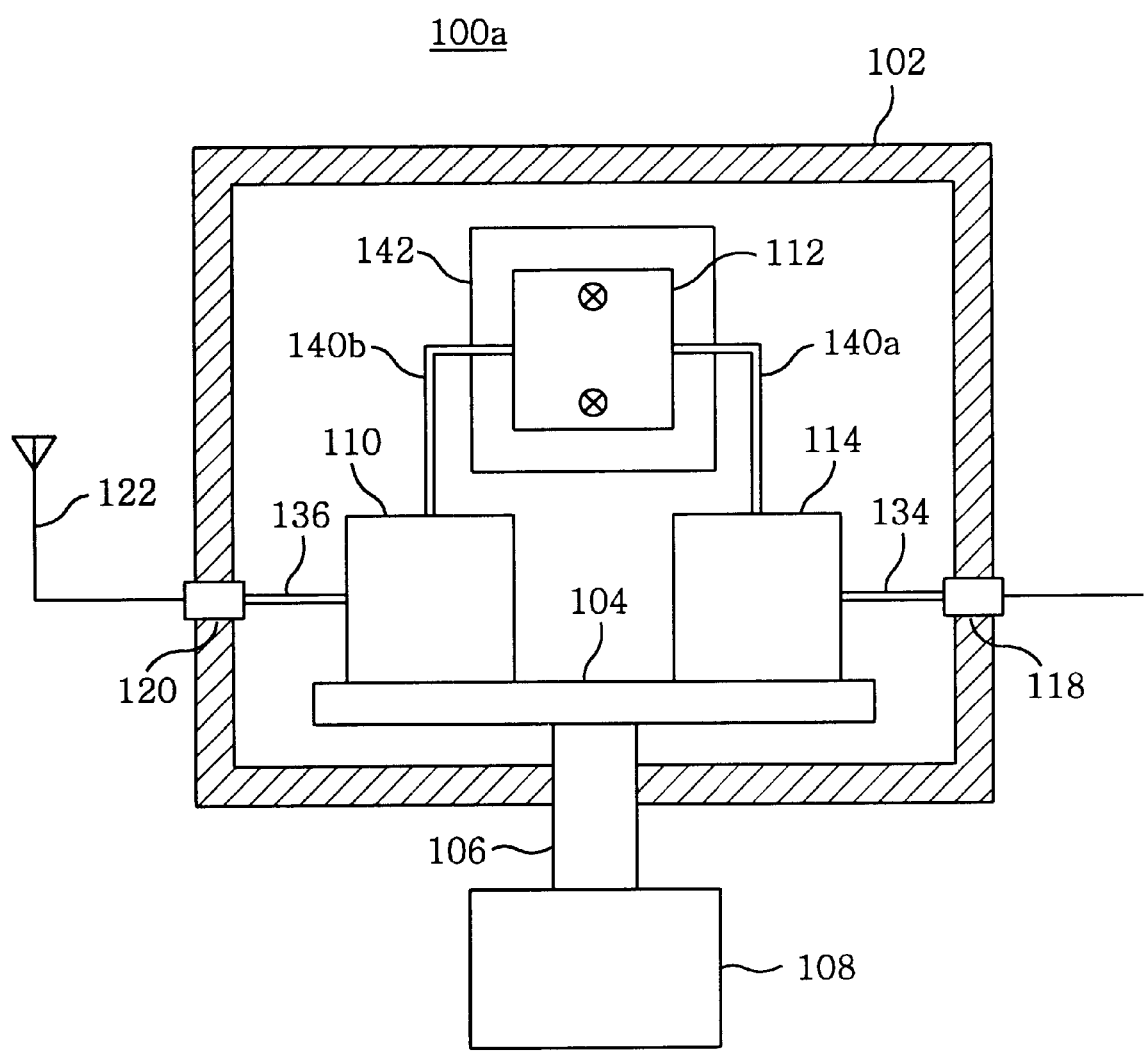
FIG. 3 represents a schematic sectional front view of an electronic apparatus in accordance with a preferred embodiment of the present invention.

In FIG. 3, an electronic apparatus 100a in accordance with a preferred embodiment of the present invention includes a thermally insulated vacuum vessel 102 and a cold head 104 disposed therein. The cold head 104 is thermally connected with a cooler 108 via a supporting column 106, which hermetically passes through a lower portion of the thermally insulated vessel 102. The supporting column 106 further serves as a circulation passage for coolant of the cooler 108 to circulate between the cold head 104 and the cooler 108.

Mounted on the cold head 104 inside the thermally insulated vessel 102 are a low noise amplifier 114 and a superconducting filter 110, which are electrically connected to a first connector 118 and a second connector 120 via a first cable 134 and a second cable 136, respectively. The first connector 118 and the second connector 120 are electrically connected to an external electronic part (not shown) and an antenna 122, respectively.

Further disposed inside the thermally insulated vessel 102 is an isolator 112, which is electrically connected to the low noise amplifier 114 and the superconducting filter 110 via a first semi-rigid cable 140a and a second semi-rigid cable 140b, respectively. Each of the semi-rigid cables 140a, 140b further serves to support the isolator 112 apart from the cold head 104 with a gap interposed therebetween. Therefore, each of the semi-rigid cables 140a, 140b must be rigid enough to support the isolator 112, but at the same time, flexible enough to be easily processed into such shape. In general, a coaxial cable having a copper tube as an outer conductor is widely used as a semi-rigid cable for supporting and connecting electronic parts, units, or modules.

A radiation plate 142 is attached to the isolator 112 and is spaced apart from the cold head 104. The radiation plate 142 is capable of: effectively receiving thermal radiation; having a high emission rate; and providing high conductivity, wherein an aluminum plate treated with black alumite can be utilized as the radiation plate 142.

The electronic parts, respectively operating at different temperatures, of the electronic apparatus 100a described above are placed in the same vessel 102. However, they are cooled at different temperatures and the cooling operation is now explained in detail.

Since the superconducting filter 110 and the low noise amplifier 114 have a direct contact with the cold head 104, they are equally cooled at the cryogenic temperature by the cooler 108. On the contrary, the isolator 112 spaced apart from the cold head 104 by the first and the second semi-rigid cables 140a, 140b, does not receive any conductive cooling by the cold head 104 at the cryogenic temperature.

In spite of the conductive make up of the semi-rigid cables 140a, 140b, high thermal resistance is achieved due to a large length to area ratio. Relatively large thermal resistance thereof guards the isolator 112 from conductive cooling of the cold head 104. However, in order to drastically reduce the amount of heat transfer therebetween, an outer conductor of the semi-rigid cables 140a, 140b can be made of stainless steel, instead of copper. The radiation plate 142 attached to the isolator 112 absorbs thermal radiation from the exterior of the thermally insulated vessel 102, thereby increasing the difference in temperatures between the isolator 112 and the other electronic parts, i.e., the superconducting filter 110 and the low noise amplifier 114. The usage of the radiation plate 142 and the material selection of the semi-rigid cables 140a, 140b depend on the cooling specifications of the electronic parts or modules.

As previously explained, the radiation plate 142 is used to effectively control the temperature of the isolator 112, wherein the heat-absorbing capacity of the radiation plate 142 is one of the main factors determining the temperature of the isolator 112. The amount of absorbed heat (the temperature of the isolator 112) depends heavily on a heat-absorbing area of the radiation plate 142.

Figure 4:
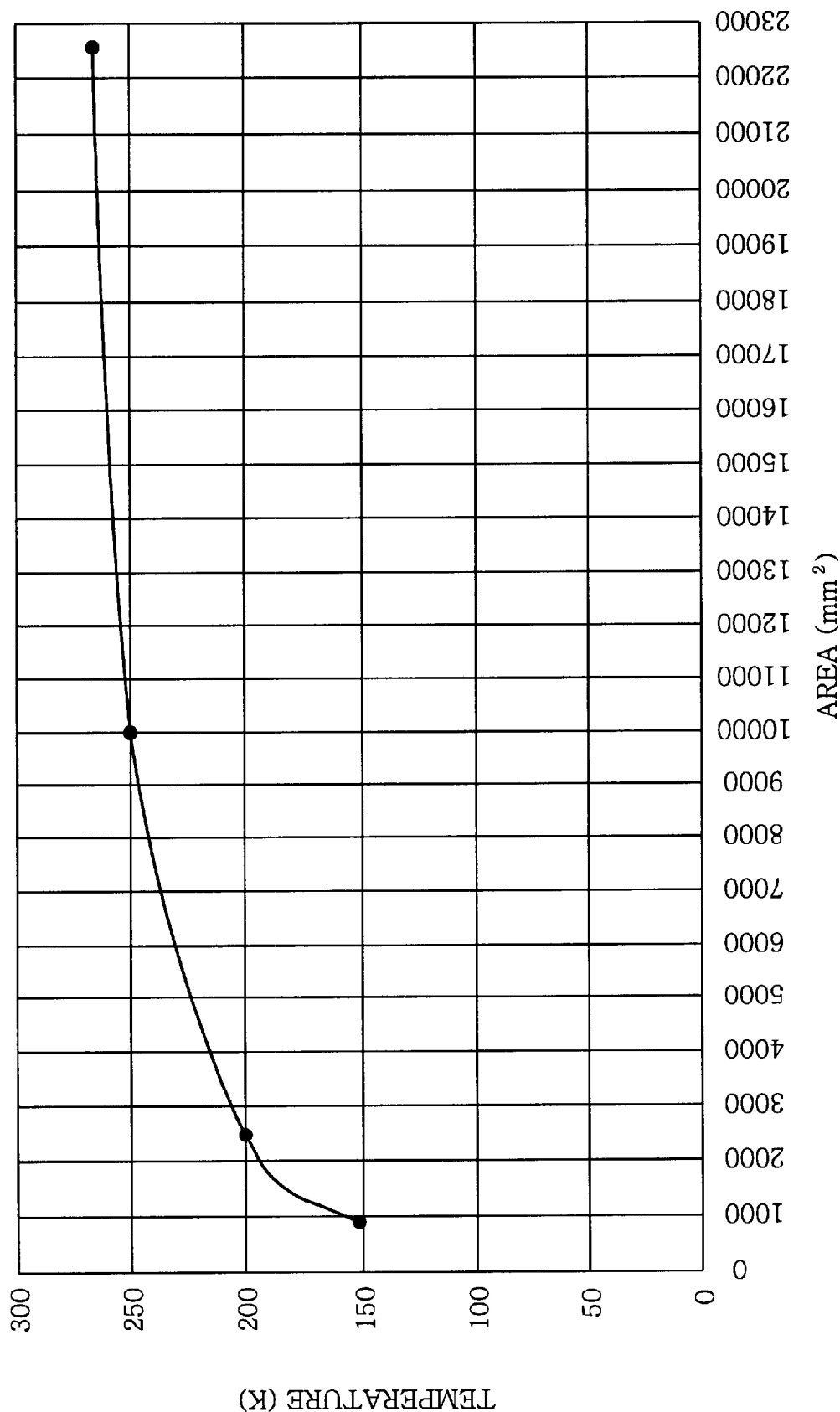
FIG. 4 is a graph showing a temperature measurement at a radiation plate.

FIG. 4 shows the relationship between the heat-absorbing area and the temperature of the isolator 112. As shown, the cooling temperature of the isolator 112 takes a value of 200 K when the radiation plate 142 attached thereto has the heat-absorbing area of 2500 mm$^2$ (alternatively, the radiation plate 142 attached thereto is a square having a 50 mm side).

The thermal resistance of each of the semi-rigid cables 140a, 140b can be also used to effectively control the temperature of the isolator 112, wherein each thermal resistance depends on the material and the surface area of each of the cables 140a, 140b.

Figure 5:
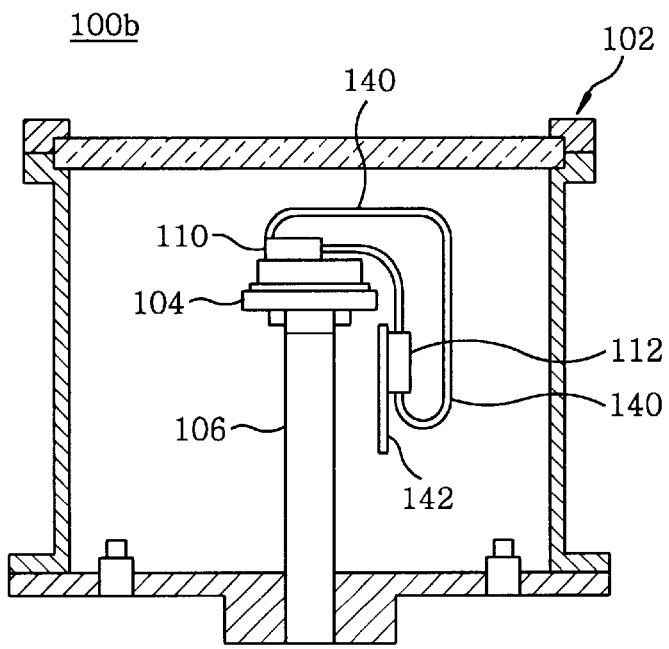
FIG. 5 shows a sectional front view of an electronic apparatus of a concrete application in accordance with the preferred embodiment of the present invention.

Referring to FIG. 5, there is illustrated an electronic apparatus 100b showing an exemplary detailed cooling structure of the preferred embodiment of the present invention described above.

In the electronic apparatus 100b, a cold head 104 is supported by a supporting column 106, which hermitically passes through a thermally insulated vessel 102. Mounted on the cold head 104 is a superconducting filter 110 connected with a semi-rigid cable 140, which supports an isolator 112 apart from the cold head 104 with a gap interposed therebetween. Attached to the isolator 112 is a radiation plate 142, which stands perpendicular to the bottom surface of the thermally insulated vessel 102 such that it can absorb thermal radiation more efficiently.

Figure 6:
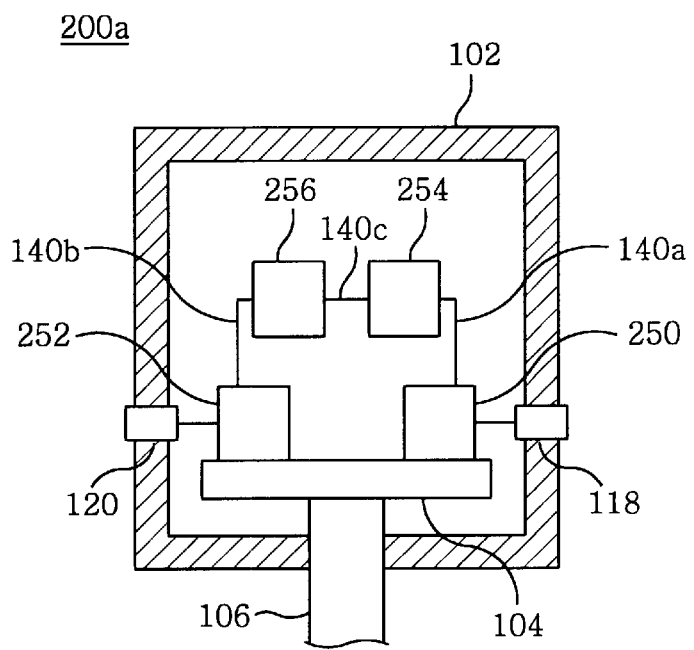
FIG. 6 describes a schematic sectional front view of the electronic apparatus in accordance with a first modification of the preferred embodiment of the present invention.
Figure 7:
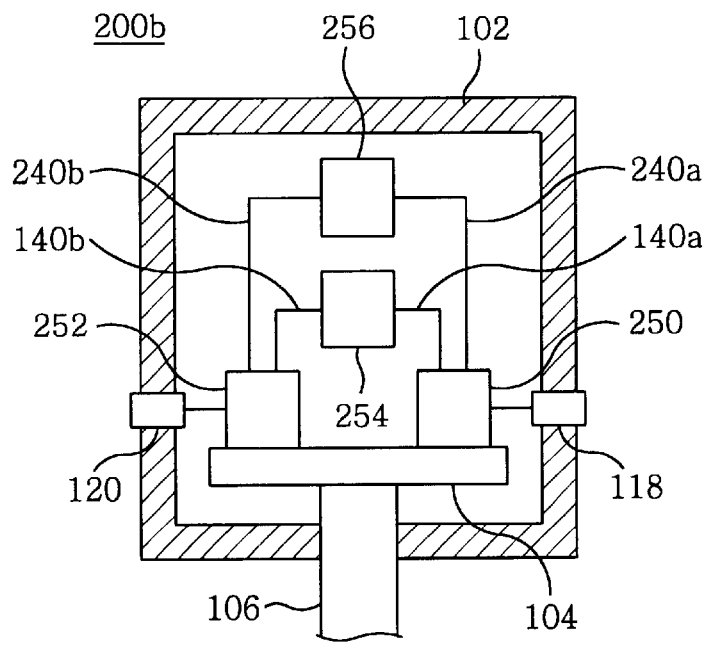
FIG. 7 provides a schematic sectional front view of the electronic apparatus in accordance with a second modification of the preferred embodiment of the present invention.
Figure 8:
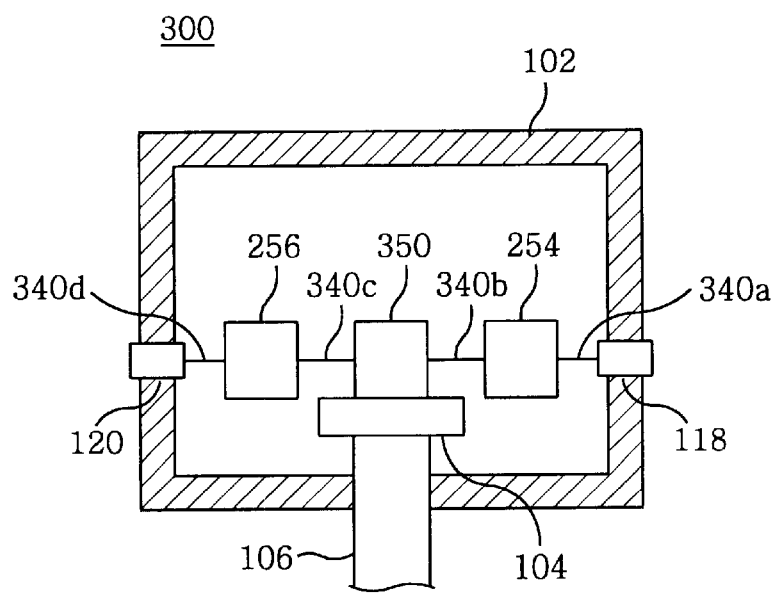
FIG. 8 sets forth a schematic sectional front view of the electronic apparatus in accordance with a third modification of the preferred embodiment of the present invention.

With reference to FIGS. 6 to 8, three different modifications of the preferred embodiment of the present invention will be described, where at least two electronic parts are protected from the cryogenic temperature.

In FIG. 6, a first cryogenic module 250 and a second cryogenic module 252 cooled at a cryogenic temperature, e.g., 60 K, are directly mounted on a cold head 104 inside of an electronic apparatus 200a of the first modification. Between the first and the second cryogenic module 250, 252, a first electronic part 254 and a second electronic part 256, which are electrically connected in series via three semi-rigid cables 140a, 140b, 140c, are cooled at a higher temperature than the cryogenic temperature. That is to say, the first electronic part 254 is suspended over the cold head 104 by the first semi-rigid cable 140a connected with the first cryogenic module 250; the second electronic part 256, by the third semi-rigid cable 140b connected with the second cryogenic module 252, wherein the second semi-rigid cable 140c connects the electronic parts 254, 256 together.

Herein, based on respective desired cooling temperatures in the electronic parts 254, 256, the surface area of the radiation plate 142 of FIG. 3 may be selectively attached thereto. Furthermore, depending on the material of the semi-rigid cables 140a, 140b, 140c, the cooling of the electronic parts 254, 256 can be further controlled.

In FIG. 7, a first cryogenic module 250 and a second cryogenic module 252 cooled at a cryogenic temperature are directly mounted on a cold head 104 in an electronic apparatus 200b of the second modification. Between the first and the second cryogenic module 250, 252, a first electronic part 254 and a second electronic part 256 which are cooled at a higher temperature than the cryogenic temperature are electrically connected in parallel via a first set of semi-rigid cables 140a, 140b and a second set of semi-rigid cables 240a, 240b, respectively. That is to say, the first electronic part 254 is suspended over the cold head 104 by the first set of semi-rigid cables 140a, 140b connected with the first and the second cryogenic module 250, 252, respectively; the second electronic part 256, by the second set of semi-rigid cables 240a and 240b.

Herein, similar to the first modification of FIG. 6, the radiation plate 142 of FIG. 3 may be selectively employed depending on a cooling temperature of the electronic parts 254, 256 and the material of the semi-rigid cables may be chosen accordingly.

In FIG. 8, a first electronic part 254, a second electronic part 256, and a cryogenic module 350 are connected in series in an electronic apparatus 300 of the third modification. The cryogenic module 350, which is cooled at a cryogenic temperature, is directly mounted on a cold head 104. The first electronic part 254 is electrically connected between a first connector 118 and the cryogenic module 350 via a first semi-rigid cable 340a and a second semi-rigid cable 340b, wherein the first electronic part 254 is suspended apart from the cold head 104. The second electronic part 256 is electrically connected between the cryogenic module 350 and a second connector 120 via a third semi-rigid cable 340c and a fourth semi-rigid cable 340d, wherein the second electronic part 256 is suspended apart from the cold head 104.

Herein, like the first and the second modification, respectively shown in FIGS. 6 and 7, the radiation plate 142 of FIG. 3 may be selectively employed and the material of the four semi-rigid cables 340a, 340b, 340c, 340d may be chosen accordingly.

Though the semi-rigid cable is employed in the preferred embodiment of the present invention, an alternative supporting member may be formed on the cold head and/or the cryogenic module to support the electronic part apart from the cold head. Furthermore, material for the supporting member is selected in due consideration of the thermal conductivity thereof.

Referring to FIG. 9, a communications apparatus, specifically, a receiver 400 in accordance with another preferred embodiment of the present invention will be described.

The receiver 400 includes a thermally insulated vacuum vessel 102 and a cold head 104 disposed therein. Further disposed inside the thermally insulated vessel 102 are a band pass filter 424 and a low noise amplifier 114, which are electrically connected together. Thermally connected with the cold head 104 is a cooler 108 disposed outside the thermally insulated vessel 102, wherein power is supplied to the cooler 108 via an external power source terminal 426. The low noise amplifier 114 can be spaced apart from the cold head 104, e.g., by a semi-rigid cable (not shown) as in FIG. 5, where the isolator 112 is in indirect contact with the cold head 104 through the cable 140 and the superconducting filter 110. The low noise amplifier 114 is further electrically connected to an external electronic part (not shown) via a first connector 118. The band pass filter 424 is mounted on the cold head 104 for a direct thermal contact therebetween and is further electrically connected to an external antenna 122 via a second connector 120.

Power is supplied to the low noise amplifier 114 by an external power source (not shown) via a power source terminal 428 formed through the thermally insulated vessel 102. Attached to the low noise amplifier 114 is a radiation plate 460, which is treated with black alumite. The band pass filter 424 directly contacts the cold head 104 and, therefore, is cooled at a cryogenic temperature. The low noise amplifier 114 which is spaced apart from the cold head 104 is cooled at a higher temperature than the band pass filter 424, which is in direct contact with the cold head 104

The radiation plate 460 attached to the low noise amplifier 114 absorbs thermal radiation from the exterior of the thermally insulated vessel 102, thereby increasing the difference in temperatures between the band pass filter 424 and the low noise amplifier 114. The amount of heat absorbed by the radiation plate 460 may be controlled by adjusting the heat-absorbing area thereof. For example, it was found that the temperature of the low noise amplifier 114 can be controlled to about 200 K when employing a cooler with a cooling capacity of 2 W-77 K and a black-alumite-treated radiation plate having an area of 2500 mm$^2$.

Accordingly, different electronic parts or modules disposed in the thermally insulated vessel can be effectively cooled at different temperatures without being overcooled by a single cooling structure. Further, by adjusting a heat-absorbing area of a radiation plate attached to an electronic part, an operating temperature of the electronic part can be controlled. Furthermore, because a semi-rigid cable serves to connect as well as support electronic parts, a more simplified configuration can be realized, wherein the temperature of the electronic parts can be further controlled by selecting a material with the appropriate thermal resistance for the semi-rigid cable.

While the invention has been shown and described with respect to the preferred embodiment, it will be understood to those skilled in the art that various changes and modifications may be made without departing from the spirit and scope of the invention as defined in the following claims.

What is claimed is:

1. An electronic apparatus having at least two electronic parts operating at different temperatures, comprising:
    a thermally insulated vessel having a cooling part therein;
    a first electronic part disposed inside the vessel;
    a second electronic part disposed inside the vessel; and
    a radiation plate attached to the second electronic part,
    wherein the second electronic part is spaced apart from the cooling part while the first electronic part is in direct contact with the cooling part,
    wherein the first electronic part is cooled by the cooling part to a cryogenic temperature; and
    wherein the second electronic part absorbs thermal radiation from the radiation plate in order to increase a temperature differential between the first and second electronic parts.

2. The electronic apparatus of claim 1, wherein the radiation plate is treated with black alumite.

3. The electronic apparatus of claim 1, further comprising a semi-rigid cable for supporting the second electronic part to be spaced apart from the cooling part.

4. The electronic apparatus of claim 1, wherein the first electronic part includes a filter and the second electronic part includes an amplifier, so that the electronic apparatus serves as a communications apparatus.

5. The electronic apparatus of claim 4, wherein the filter is made of a superconducting material, which is cooled and set in a superconducting state by the cooling part.

6. The electronic apparatus of claim 1, wherein the first electronic part has at least one superconducting material, which is cooled and set in a superconducting state by cooling part.

7. The electronic apparatus of claim 1, wherein an area of the radiation plate is set such that the second electronic part is at a desired cooled temperature.

8. A receiver comprising:
    a thermally insulated vessel;
    a cold head disposed inside the thermally insulated vessel;
    a superconducting filter mounted on the cold head in order to cool the superconducting filter;
    a low noise amplifier disposed inside the thermally insulated vessel, wherein the low noise amplifier is spaced apart from the cold head and electrically connected to the superconducting filter; and
    a radiation plate which is attached to the low noise amplifier and absorbs thermal radiation in order to increase a temperature differential between the low noise amplifier and the superconducting filter.

9. The apparatus of claim 8, wherein the superconducting filter is cooled at a cryogenic temperature of about 60 K while the low noise amplifier is cooled at a temperature higher than the cryogenic temperature of about 200 K.

* * * * *